(12) United States Patent
Fest et al.

(10) Patent No.: US 9,385,313 B2
(45) Date of Patent: Jul. 5, 2016

(54) RESISTIVE MEMORY CELL HAVING A REDUCED CONDUCTIVE PATH AREA

(71) Applicant: Microchip Technology Incorporated, Chandler, AZ (US)

(72) Inventors: Paul Fest, Chandler, AZ (US); James Walls, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/184,331

(22) Filed: Feb. 19, 2014

(65) Prior Publication Data

US 2015/0236255 A1     Aug. 20, 2015

(51) Int. Cl.
*H01L 45/00*     (2006.01)
*H01L 27/24*     (2006.01)

(52) U.S. Cl.
CPC .......... *H01L 45/122* (2013.01); *H01L 27/2463* (2013.01); *H01L 45/08* (2013.01); *H01L 45/1273* (2013.01); *H01L 45/1608* (2013.01); *H01L 45/1675* (2013.01)

(58) Field of Classification Search
CPC .................. H01L 45/08; H01L 45/085; H01L 45/122–45/124; H01L 45/1256; H01L 45/1266; H01L 45/1273; H01L 45/16; H01L 45/1691; H01L 27/2481; H01L 27/249
See application file for complete search history.

(56) References Cited

U.S. PATENT DOCUMENTS

| | | | |
|---|---|---|---|
| 5,790,455 A | 8/1998 | Caywood | 635/185.06 |
| 5,962,872 A * | 10/1999 | Zhang et al. | 257/66 |
| 5,986,931 A | 11/1999 | Caywood | 365/185.06 |
| 6,031,287 A | 2/2000 | Harshfield | 257/734 |
| 6,147,395 A | 11/2000 | Gilgen | 257/529 |
| 6,436,611 B1 | 8/2002 | Lee | 430/314 |

(Continued)

FOREIGN PATENT DOCUMENTS

| | | | | |
|---|---|---|---|---|
| CN | 102130145 A | 7/2011 | | H01L 27/24 |
| DE | 102007049786 A1 | 4/2009 | | H01L 27/24 |

(Continued)

OTHER PUBLICATIONS

Kozicki, M., "Nanoscale Memory Elements Based on Solid-State Electrolytes," IEEE Transactions on Nano Technology, vol. 4, No. 3, 8 pages, May 2005.

(Continued)

*Primary Examiner* — Laura Menz
*Assistant Examiner* — Candice Y Chan
(74) *Attorney, Agent, or Firm* — Slayden Grubert Beard PLLC

(57) ABSTRACT

A method of forming a resistive memory cell, e.g., a CBRAM or ReRAM, may include forming a bottom electrode layer, forming an oxide region of an exposed area of the bottom electrode, removing a region of the bottom electrode layer proximate the oxide region to form a bottom electrode having a pointed tip or edge region, and forming first and second electrolyte regions and first and second top electrodes over the bottom electrode to define distinct first and second memory elements. The first memory element defines a first conductive filament/vacancy chain path from the first portion of the bottom electrode pointed tip region to the first top electrode via the first electrolyte region, and second memory element defines a second conductive filament/vacancy chain path from the second portion of the bottom electrode pointed tip region to the second top electrode via the second electrolyte region.

23 Claims, 9 Drawing Sheets

(56) References Cited

U.S. PATENT DOCUMENTS

| | | | |
|---|---|---|---|
| 2002/0036931 A1 | 3/2002 | Lowrey et al. | 365/200 |
| 2002/0039306 A1 | 4/2002 | Lowrey | 365/100 |
| 2004/0192009 A1 | 9/2004 | Belyansky et al. | 438/424 |
| 2005/0029505 A1 | 2/2005 | Lowrey | 257/5 |
| 2006/0006443 A1 | 1/2006 | Lowrey et al. | 257/296 |
| 2006/0097238 A1 | 5/2006 | Breuil et al. | 257/4 |
| 2007/0097738 A1 | 5/2007 | Asano et al. | 365/163 |
| 2007/0267618 A1 | 11/2007 | Zaidi et al. | 257/2 |
| 2008/0012079 A1 | 1/2008 | Zaidi | 257/379 |
| 2009/0017591 A1 | 1/2009 | Cervin-lawry et al. | 438/384 |
| 2009/0026438 A1 | 1/2009 | Lin | 257/4 |
| 2009/0096568 A1 | 4/2009 | Hosoi et al. | 338/20 |
| 2009/0200640 A1 | 8/2009 | Hosoi et al. | 257/536 |
| 2010/0019218 A1 | 1/2010 | Chung | 257/4 |
| 2010/0025279 A1 | 2/2010 | Baker et al. | 206/503 |
| 2010/0084741 A1 | 4/2010 | Andres et al. | 257/536 |
| 2010/0163829 A1 | 7/2010 | Wang et al. | 257/3 |
| 2010/0193762 A1 | 8/2010 | Hsieh et al. | 257/4 |
| 2010/0264396 A1 | 10/2010 | Lung et al. | 257/3 |
| 2011/0147694 A1 | 6/2011 | Song et al. | 257/3 |
| 2011/0180775 A1 | 7/2011 | Lin et al. | 257/4 |
| 2011/0291064 A1* | 12/2011 | Marsh et al. | 257/4 |
| 2012/0294065 A1 | 11/2012 | Hong et al. | 365/148 |
| 2012/0313071 A1 | 12/2012 | Gopalan | 257/4 |
| 2012/0319072 A1 | 12/2012 | Wei et al. | 257/4 |
| 2013/0001501 A1 | 1/2013 | Sills | 257/4 |
| 2013/0112936 A1 | 5/2013 | Wei et al. | 257/4 |
| 2013/0214234 A1 | 8/2013 | Gopalan et al. | 257/3 |
| 2013/0252431 A1 | 9/2013 | Chen et al. | 438/702 |
| 2013/0336046 A1 | 12/2013 | Oh | 365/163 |
| 2014/0264245 A1 | 9/2014 | Walls | 257/4 |
| 2015/0236255 A1 | 8/2015 | Fest et al. | 257/3 |
| 2015/0236258 A1 | 8/2015 | Fest et al. | 257/3 |

FOREIGN PATENT DOCUMENTS

| | | | |
|---|---|---|---|
| EP | 1355365 A2 | 10/2003 | H01L 27/10 |
| EP | 2202816 A1 | 6/2010 | H01L 27/24 |
| EP | 2267775 A2 | 12/2010 | G11C 16/04 |
| EP | 2339585 A1 | 6/2011 | G11C 16/00 |
| WO | 2012/057772 A1 | 5/2012 | H01L 21/8247 |
| WO | 2012/167286 A1 | 12/2012 | G11C 11/34 |
| WO | 2014/164015 A1 | 10/2014 | H01L 45/00 |

OTHER PUBLICATIONS

Chen, A., "Non-Volatile Resistive Switching for Advanced Memory Applications," IEDM Technical Digest, 4 pages, 2005.

Balakrishnan, M. et al., "A Low Power Non-Volatile Memory Element Based on Copper in Deposited Silicon Oxide," Non-Volatile Memory Technology Symposium, 7 pages, 2006.

Schindler, C. et al., "Bipolar and Unipolar Resistive Switching in CU-Doped SiO2," IEEE Transactions on Electron Devices, vol. 54, No. 10, 7 pages, 2007.

Chen, A., "Ionic Memories: Status and Challenges," Non-Volatile Memory Technology Symposium, 5 pages, 2008.

Valov, I. et al., "Electrochemical Metallization Memories—Fundamentals, Applications, Prospects," Nanotechnology, vol. 22, No. 25, 22 pages, Jun. 24, 2011.

Jou, S. et al., "Resistance Switching Properties in Cu/Cu—SiO2/TaN Device," Proceeding World Congress on Engineering, vol. 2, 4 pages, Jul. 6, 2011.

Yang, L. et al., "Linear Scaling of Reset Current Down to 22-nm Node for a Novel CuxSiyO RRAM," IEEE Electron Device Letters, vol. 33, No. 1, 3 pages, 2012.

International Search Report and Written Opinion, Application No. PCT/US2014/019868, 10 pages, Jun. 5, 2014.

International Search Report and Written Opinion, Application No. PCT/US2014/019906, 12 pages, Jul. 2, 2014.

International Search Report and Written Opinion, Application No. PCT/US2014/020188, 10 pages, May 13, 2014.

International Search Report and Written Opinion, Application No. PCT/US2014/022194, 11 pages, May 16, 2014.

U.S. Non-Final Office Action, U.S. Appl. No. 14/184,177, 12 pages, Jun. 19, 2015.

U.S. Non-Final Office Action, U.S. Appl. No. 14/183,792, 23 pages, Jul. 8, 2015.

U.S. Non-Final Office Action, U.S. Appl. No. 14/183,674, 26 pages, Jul. 8, 2015.

U.S. Non-Final Office Action, U.S. Appl. No. 14/183,831, 18 pages, Jul. 9, 2015.

U.S. Non-Final Office Action, U.S. Appl. No. 14/183,738, 26 pages, Jul. 16, 2015.

U.S. Non-Final Office Action, U.S. Appl. No. 14/183,953, 27 pages, Jul. 31, 2015.

International Search Report and Written Opinion, Application No. PCT/US2015/016321, 11 pages, Jul. 14, 2015.

International Search Report and Written Opinion, Application No. PCT/US2015/016268, 9 pages, May 4, 2015.

International Search Report and Written Opinion, Application No. PCT/US2015/016259, 16 pages, May 6, 2015.

International Search Report and Written Opinion, Application No. PCT/US2015/016244, 11 pages, May 7, 2015.

International Search Report and Written Opinion, Application No. PCT/US2015/016334, 11 pages, Dec. 7, 2015.

U.S. Final Office Action, U.S. Appl. No. 14/183,831, 13 pages, Feb. 2, 2016.

U.S. Final Office Action, U.S. Appl. No. 14/184,034, 29 pages, Dec. 16, 2015.

International Search Report and Written Opinion, Application No. PCT/US2015/062758, 12 pages. Mar. 2, 2016.

* cited by examiner

RESISTIVE MEMORY CELL HAVING A REDUCED CONDUCTIVE PATH AREA

TECHNICAL FIELD

The present disclosure relates to resistive memory cells, e.g., conductive bridging random access memory (CBRAM) or resistive random-access memory (ReRAM) cells, having a reduced area for the formation of conductive paths (e.g., conductive filaments or vacancy chains).

BACKGROUND

Resistive memory cells, such as conductive bridging memory (CBRAM) and resistive RAM (ReRAM) cells are a new type of non-volatile memory cells that provide scaling and cost advantages over conventional Flash memory cells. A CBRAM is based on the physical re-location of ions within a solid electrolyte. A CBRAM memory call can be made of two solid metal electrodes, one relatively inert (e.g., tungsten) the other electrochemically active (e.g., silver or copper), with a thin film of the electrolyte between them. The fundamental idea of a CBRAM cell is to create programmable conducting filaments, formed by either single or very few nanometer-scale ions across a normally non-conducting film through the application of a bias voltage across the non-conducting film. The non-conducting film is referred to as the electrolyte since it creates the filament through an oxidation/reduction process much like in a battery. In a ReRAM cell the conduction is through creation of a vacancy chain in an insulator. The creation of the filament/vacancy-chain creates an on-state (high conduction between the electrodes), while the dissolution of the filament/vacancy-chain is by applying a similar polarity with Joule heating current or an opposite polarity but at smaller currents to revert the electrolyte/insulator back to its nonconductive off-state.

A wide range of materials have been demonstrated for possible use in resistive memory cells, both for the electrolyte and the electrodes. One example is the Cu/SiOx based cell in which the Cu is the active metal-source electrode and the SiOx is the electrolyte.

One common problem facing resistive memory cells is the on-state retention, i.e., the ability of the conductive path (filament or vacancy chain) to be stable, especially at the elevated temperatures that the memory parts would typically be qualified to (85 C/125 C).

FIG. 1 shows a conventional CBRAM cell 1A, having a top electrode 10 (e.g., copper) arranged over a bottom electrode 12 (e.g., tungsten), with the electrolyte or middle electrode 14 (e.g., $SiO_2$) arranged between the top and bottom electrodes. Conductive filaments 18 propagate from the bottom electrode 12 to the top electrode 10 through the electrolyte 14 when a bias voltage is applied to the cell 1A. This structure has various potential limitations or drawbacks. For example, the effective cross-sectional area for filament formation, referred to herein as the effective filament formation area indicated as $A_{FF}$, or alternatively the "confinement zone," is relatively large and unconfined, making the filament formation area susceptible to extrinsic defects. Also, multi-filament root formation may be likely, due to a relatively large area, which may lead to weaker (less robust) filaments. In general, the larger the ratio between the diameter or width of the effective filament formation area $A_{FF}$ (indicated by "x") to the filament propagation distance from the bottom electrode 12 to the top electrode 10 (in this case, the thickness of the electrolyte 14, indicated by "y"), the greater the chance of multi-root filament formation. Further, a large electrolyte volume surrounds the filament, which provides diffusion paths for the filament and thus may provide poor retention. Thus, restricting the volume of the electrolyte material in which the conductive path forms may provide a more robust filament due to spatial confinement. The volume of the electrolyte material in which the conductive path forms may be restricted by reducing the area in contact between the bottom electrode 12 and the electrolyte 14.

As used herein, "conductive path" refers a conductive filament (e.g., in a CBRAM cell), vacancy chain (e.g., in an oxygen vacancy based ReRAM cell), or any other type of conductive path for connecting the bottom and top electrodes of a non-volatile memory cell (typically through an electrolyte layer or region arranged between the bottom and top electrodes). As used herein the "electrolyte layer" or "electrolyte region" refers to an electrolyte/insulator/memory layer or region between the bottom and top electrodes through which the conductive path propagates.

FIG. 2 shows certain principles of a CBRAM cell formation. Conductive paths 18 may form and grow laterally, or branch into multiple parallel paths. Further, locations of the conductive paths may change with each program/erase cycle. This may contribute to a marginal switching performance, variability, high-temp retention issues, and/or switching endurance. Restricting switching volume has been shown to benefit the operation. These principles apply to ReRAM and CBRAM cells. A key obstacle for adoption of these technologies is switching uniformity.

FIGS. 3A and 3B show a schematic view and an electron microscope image of an example known bottom electrode configuration 1B for a CBRAM cell (e.g., having a one-transistor, one-resistive memory element (1T1R) architecture). In this example, the bottom electrode 12 is a cylindrical via, e.g., a tungsten-filled via with a Ti/TiN liner. The bottom electrode 12 may provide a relatively large effective filament formation area $A_{FF}$, or confinement zone, of about 30,000 $nm^2$, for example, which may lead to one or more of the problems or disadvantages discussed above.

SUMMARY

Some embodiments provide resistive memory cells, e.g., CBRAM or ReRAM cells, that focus the electric field more precisely than in known cells, which may provide more consistent filament formation, thus improving the consistency of programming voltage and cell predictability. For example, some embodiments provide a memory cell structure in which two separate edge regions of a bottom electrode are used to define two separate memory elements from a single cell structure, wherein each of the two edge regions of the bottom electrode provides a highly focused electric field emanating from the bottom electrode. In some embodiments, the effective cross-sectional area, or "confinement zone," of such memory elements may be reduced in comparison to known resistive memory cells. For example, the confinement zone of each memory element may be reduced to less than 1,000 $nm^2$, less than 100 $nm^2$, less than 10 $nm^2$, or even less than 1 $nm^2$.

According to one embodiment, a method of forming a resistive memory cell, e.g., a CBRAM or ReRAM, may include forming a bottom electrode layer on a substrate; oxidizing an exposed region of the bottom electrode layer to form an oxide region; removing a region of the bottom electrode layer proximate the oxide region, thereby forming a bottom electrode having a pointed tip region adjacent the oxide region, and forming (a) a first electrolyte region and first top electrode over a first portion of the pointed tip region of the bottom electrode, such that the first electrolyte region is arranged between the first top electrode and the first portion of the pointed tip region of the bottom electrode to define a first memory element, and (b) a second electrolyte region and second top electrode over a second portion of the pointed tip region of the bottom electrode, such that the second electrolyte region is arranged between the second top electrode and the second portion of the pointed tip region of the bottom electrode to define a second memory element, wherein the second electrolyte region and second top electrode are physically separate from the first electrolyte region and first top electrode. The first memory element defines a first path for conductive filament or vacancy chain formation from the first portion of the pointed tip region of the bottom electrode to the first top electrode via the first electrolyte region when a voltage bias is applied to the first memory element, and the second memory element likewise provides a second path for conductive filament or vacancy chain formation from the second portion of the pointed tip region of the bottom electrode to the second top electrode via the second electrolyte region when a voltage bias is applied to the second memory element.

According to another embodiment, a method of forming an array of memory elements may include forming a bottom electrode layer on a substrate; oxidizing a plurality of exposed regions of the bottom electrode layer to form a plurality of oxide regions spaced apart from each other; removing regions of the bottom electrode layer between adjacent oxide regions, thereby forming a plurality of bottom electrodes, each bottom electrode having a respective oxide region at an upper side of the bottom electrode and a pointed tip adjacent the respective oxide region; and for each bottom electrode, forming a pair of memory elements, each memory element defined by a respective region of the bottom electrode pointed tip, a respective top electrode, and an electrolyte region arranged therebetween.

According to another embodiment, an array of resistive memory structures is provided. Each memory structure may include a bottom electrode formed on a substrate; an oxide region adjacent the bottom electrode; wherein the bottom electrode has a pointed tip region proximate the oxide region; a first electrolyte region and first top electrode formed over a first portion of the pointed tip region of the bottom electrode, with the first electrolyte region arranged between the first top electrode and the first portion of the pointed tip region of the bottom electrode to define a first memory element; and a second electrolyte region and second top electrode over a second portion of the pointed tip region of the bottom electrode, with the second electrolyte region is arranged between the second top electrode and the second portion of the pointed tip region of the bottom electrode to define a second memory element.

BRIEF DESCRIPTION OF THE FIGURES

Example embodiments are discussed below with reference to the drawings, in which.

DETAILED DESCRIPTION

Figure 1:
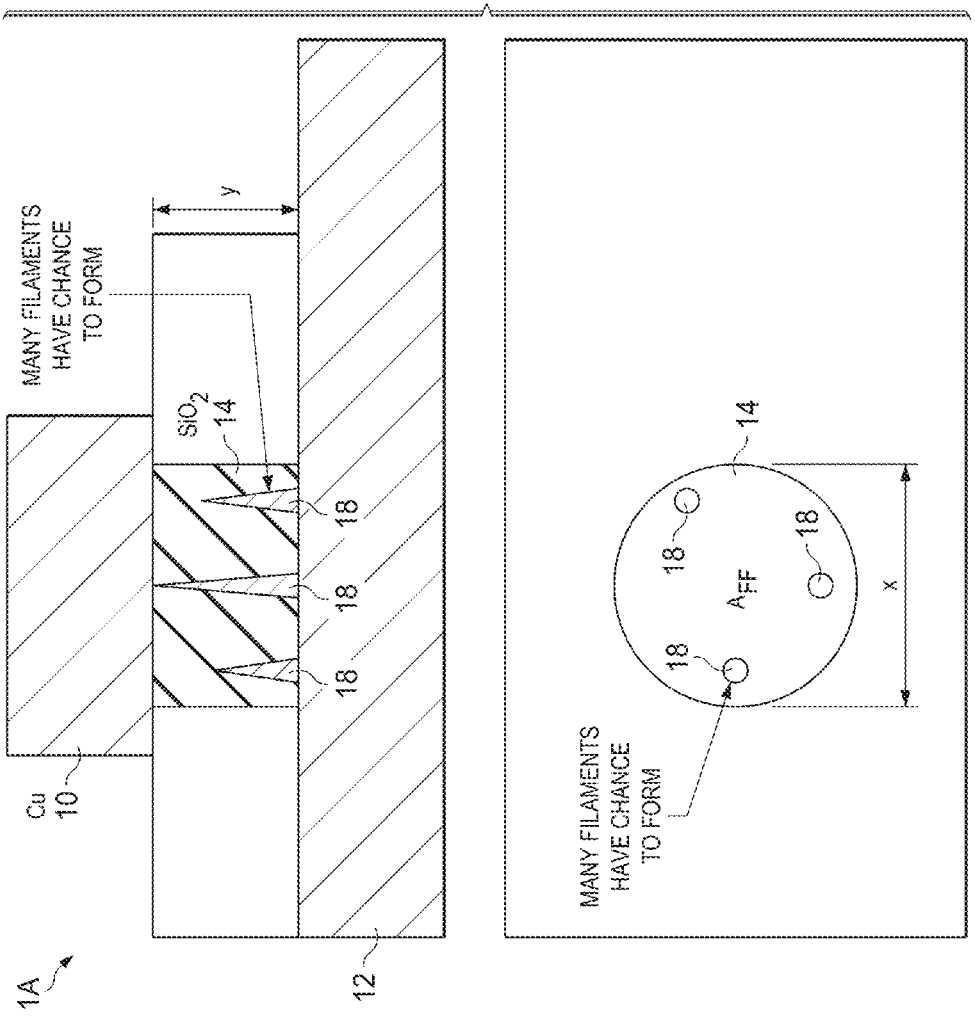
FIG. 1 shows an example conventional CBRAM cell.
Figure 2:
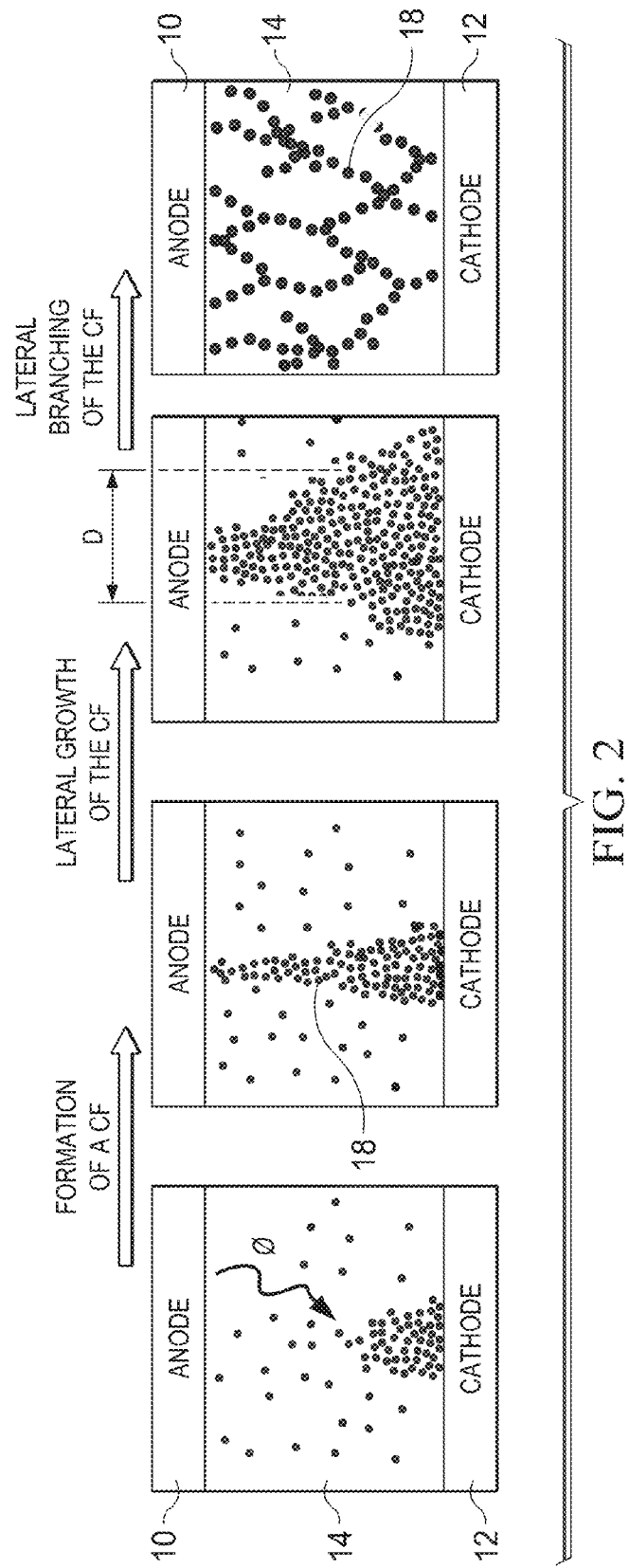
FIG. 2 shows certain principles of CBRAM cell formation.
Figure 3B:
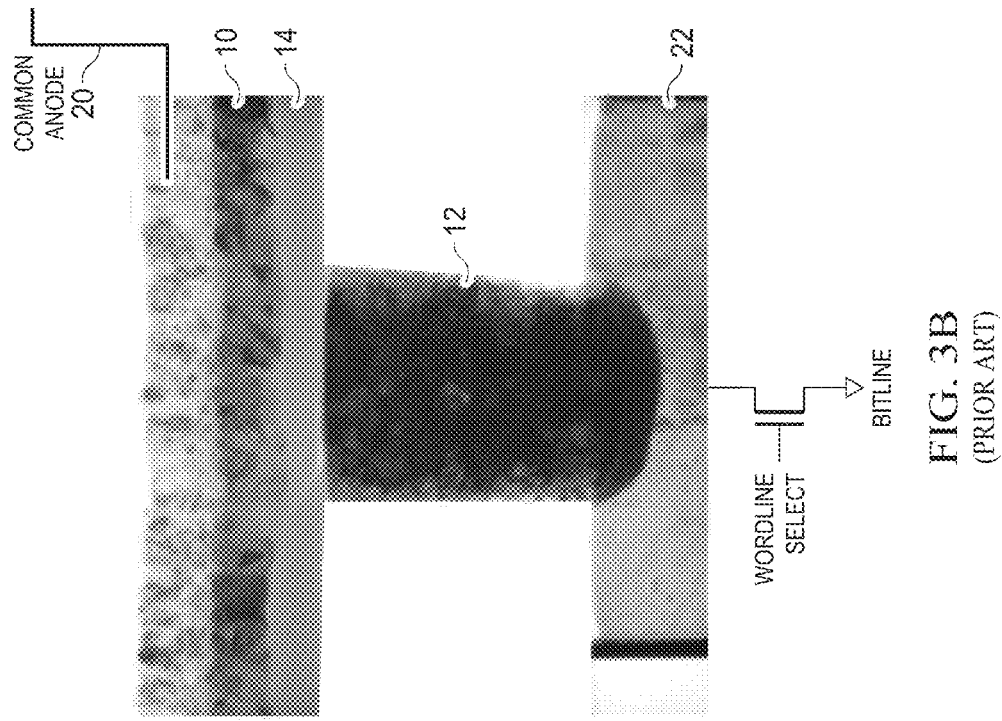
FIGS. 3A and 3B show a schematic view and an electron microscope image of an example known CBRAM cell configuration.
Figure 3A:
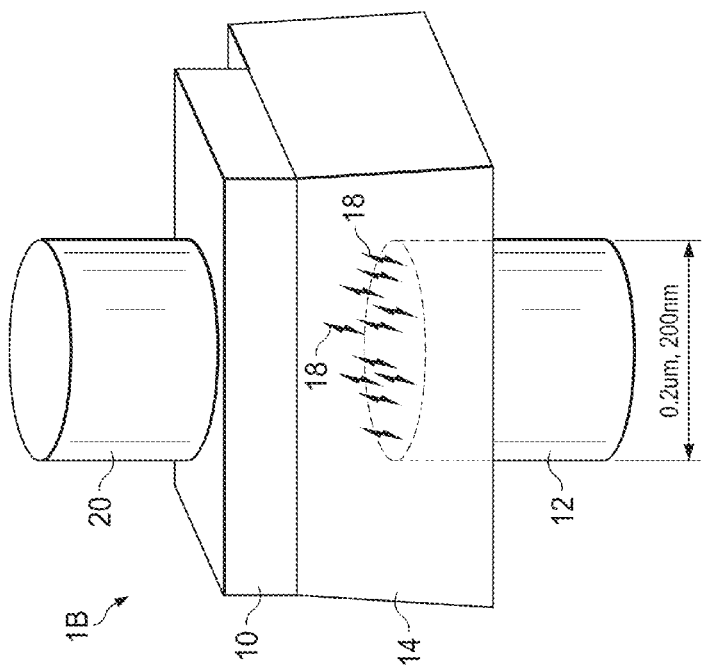
Figure 4A:
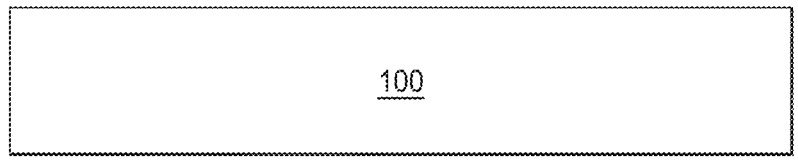
FIGS. 4A-4M illustrate an example method for forming an array of resistive memory cells, e.g., CBRAM or ReRAM cells, according to one embodiment of the present invention.
Figure 4B:
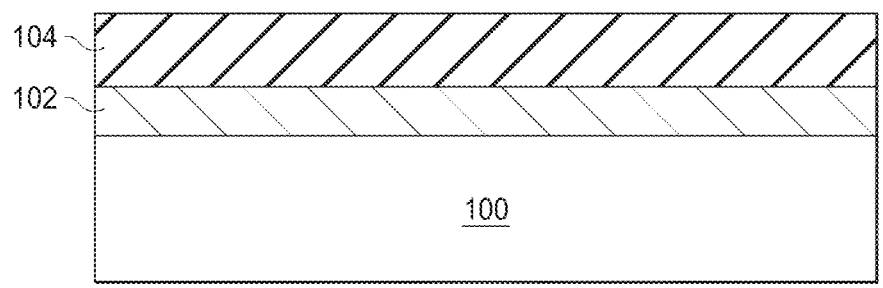

FIGS. 4A-4M illustrate an example method for forming an array of resistive memory cells, e.g., an array of conductive bridging memory (CBRAM) and resistive RAM (ReRAM) cells, according to one embodiment. As shown in FIG. 4A, a dielectric substrate 100 (e.g., $SiO_2$) is formed, using any suitable technique. Next, as shown in FIG. 4B, a bottom electrode layer 102 and a hard mask layer 104 are deposited or formed over the dielectric substrate 100. Bottom electrode layer 102 may comprise any suitable conductive material or materials, e.g., polysilicon, doped polysilicon, amorphous silicon, doped amorphous silicon, or any other suitable material, and may be deposited or formed in any suitable manner. Hard mask layer 104 may be formed from any suitable materials (e.g., silicon nitride) and may be deposited or formed in any suitable manner as known in the art.

Figure 4C:
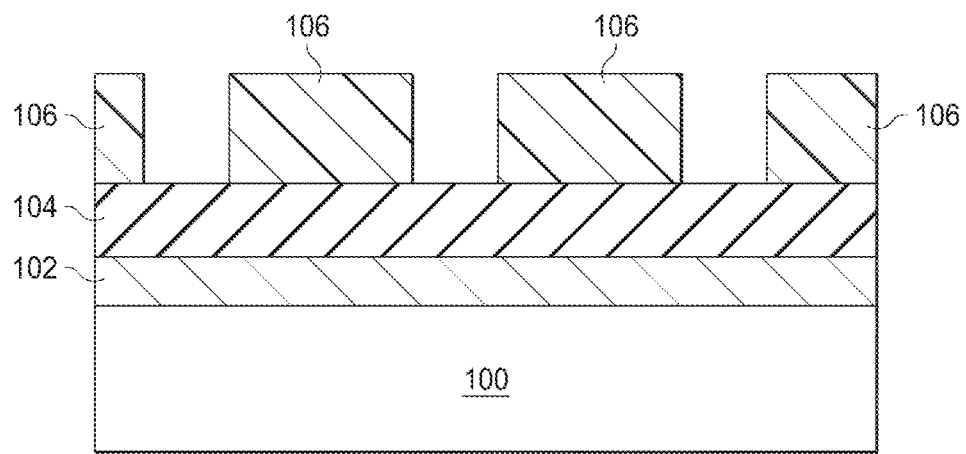

Next, as shown in FIG. 4C, the hard mask layer 104 is patterned, e.g., by forming and patterning a photoresist layer 106 over the hard mask layer 104, using any suitable photolithography techniques. As shown, certain areas of the hard mask layer 104 are exposed through the patterned photoresist layer 106. Next, as shown in FIG. 4D, an etching process is performed to remove the photoresist layer 106 and portions of the hard mask layer 104 corresponding to the exposed areas shown in FIG. 4C, thereby forming a patterned hard mask 104A having an array of openings 105.

Figure 4D:
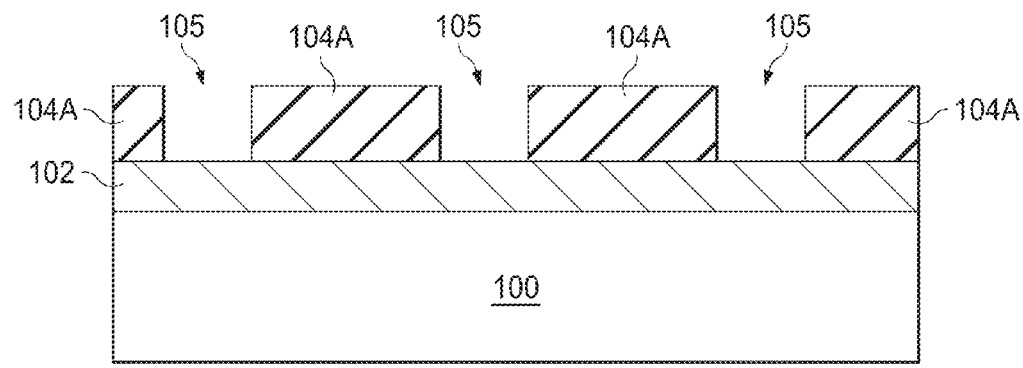

The patterning and etching processes of FIGS. 4C and 4D may be selected such that openings 105 have any desired size and shape. For example, openings 105 may have a circular or oval shaped cross-section (in a plane parallel to the bottom electrode layer 102), thus providing cylindrical or elongated cylindrical openings 105. As another example, openings 105 may have a rectangular or otherwise elongated cross-section (in a plane parallel to the bottom electrode layer 102), thus providing elongated trench-style openings 105. Openings 105 may have any other suitable shapes and sizes.

Figure 4E:
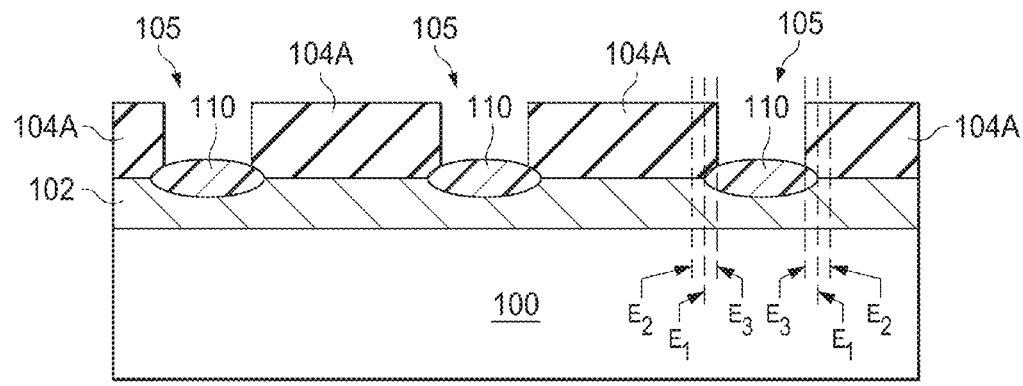

Next, as shown in FIG. 4E, an oxidation process is performed to oxidize areas of the bottom electrode layer 102 that are exposed through the openings 105 in patterned hard mask 104A, thereby forming a number of spaced-apart oxide regions 110. In some embodiments, each oxide region 110 may have a generally oval, rounded, curved, or otherwise non-orthogonal shape in a cross-section extending perpendicular to the bottom electrode layer 102 (i.e., the cross-section shown in FIG. 4E).

Figure 4F:
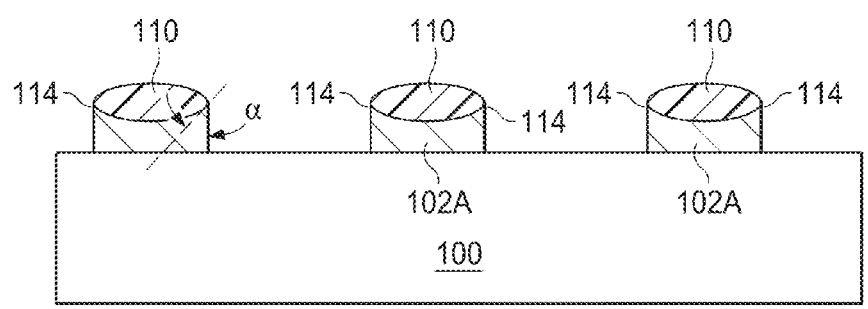

Next, as shown in FIG. 4F, the hard mask 104A is removed and the remaining bottom electrode layer 102 and oxide regions 110 are etched to form an array of spaced-apart bottom electrodes 102A and corresponding oxide regions 110. Alternatively, the hard mask 104A may be removed during the etching of the bottom electrodes 102A. The bottom electrode layer 102 and oxide regions 110 may be etched in any suitable manner, e.g., by applying and utilizing a patterned mask or photoresist above the stack, or by using the oxide regions 110 themselves as a mask (e.g., using an etch selective to the non-oxidized bottom electrode material). The etch may or may not be patterned to follow the pattern defined by openings 105 (and thus the pattern of oxide regions 110). Thus, bottom electrodes 102A may have any shape and size, which may or may not correspond with the shapes and sizes of the openings 105 and oxide regions 110 prior to the etch process. For example, bottom electrodes 102A may have a cylindrical or elongated cylindrical shape having a circular or oval shaped perimeter, or an rectangular prism shape have an elongated rectangular perimeter.

In addition, the lateral edges of the etch may be selected with respect to the lateral or outer perimeter edge or extent of each oxide region 110. For example, with reference to FIG. 4E, the lateral edges of the etch may align with the outer perimeter edge of each oxide region 110, as indicated by dashed lines $E_1$. Alternatively, the lateral edges of the etch may be aligned outside the outer perimeter edge of each oxide region 110, as indicated by dashed lines $E_2$, such that the post-etch bottom electrode 102A has a region laterally outside the outer perimeter edge of the oxide region 110. Alternatively, the lateral edges of the etch may be aligned inside the outer perimeter edge of each oxide region 110, as indicated by dashed lines $E_3$, such that the etch extends removes an outer portion of the oxide region 110.

Returning to FIG. 4F, each bottom electrode 102A has a pointed tip region 114 adjacent the respective oxide region. The shape of the pointed tip region 114 may be at least partially defined by the oxide region 110. For example, where the vertical cross-section of the oxide region 110 is oval shaped or otherwise curves downwardly toward the substrate 100, the curved area toward the lateral perimeter of the oxide region 110 helps define the shape of the pointed tip region 114 of the bottom electrode 102A. Thus, in the vertical plane, the pointed tip region 114 may define an angle α of less than 90 degrees, as shown in FIG. 4F.

The pointed tip region 114 may extend partially or fully around the lateral perimeter of the bottom electrode 102A (e.g., a circular, oval, or rectangular perimeter). In some embodiments, the lateral perimeter of the bottom electrode 102A defines a plurality of sides (e.g., a rectangular perimeter defining four sides), and the pointed tip region 114 extends along one, two, three, or more of the perimeter sides.

Figure 4G:
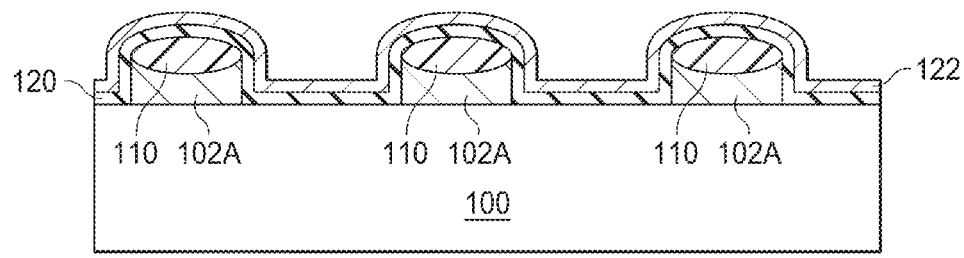

Next, as shown in FIG. 4G, an electrolyte layer 120 and a top electrode layer 122 are formed over the array of bottom electrode 102A and corresponding oxide regions 110. Electrolyte layer 120 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 122 may comprise any suitable conductive material or materials, e.g., Ag, Al, Cu, Ta, TaN, Ti, TiN, Al, W or any other suitable material, and may be deposited or formed in any suitable manner.

Figure 4H:
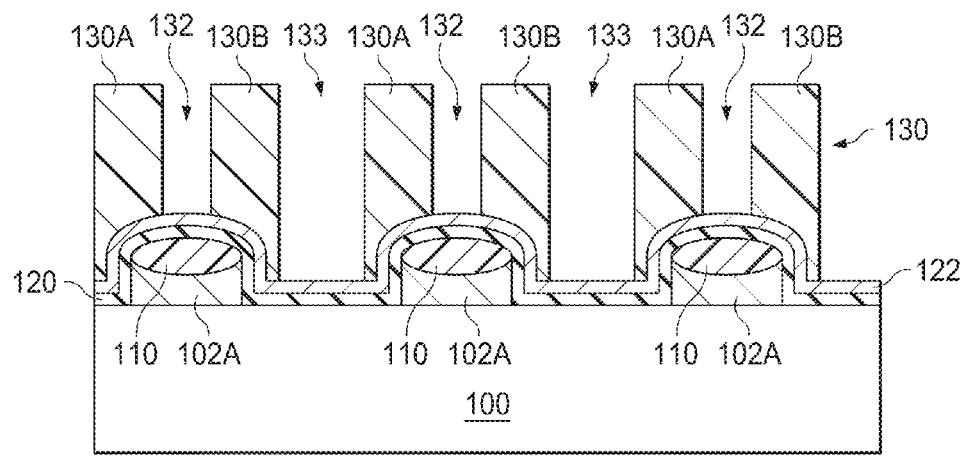

Next, as shown in FIG. 4H, the stack is patterned, e.g., by forming and patterning a photomask 130 over the top electrode layer 122, using any suitable photolithography techniques. As shown, photomask 130 may be patterned in a manner that defines a pair of photomask regions 130A and 130B separated by a gap 132 over each cell structure, with a central area of each cell structure being exposed through each gap 132. Further, the pair of photomask regions 130A and 130B over each cell structure is separated from the adjacent pair of photomask regions 130A and 130B by a gap 133.

Figure 4I:
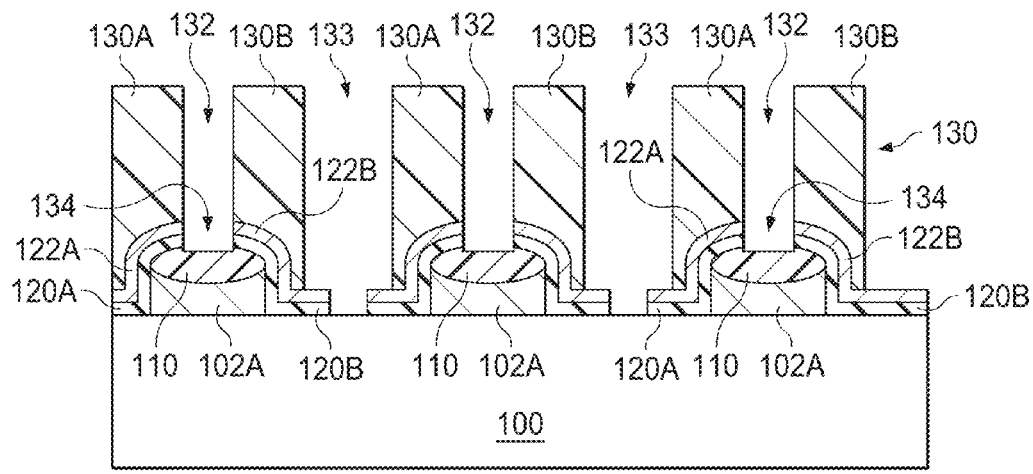

Next, as shown in FIG. 4I, an etching process is performed through gaps 132 and 133 to remove exposed portions of the top electrode layer 122 and underlying portions of electrolyte layer 120. In some embodiments, the etch may be selective with respect to the oxide region 110 such that the oxide region 110 and underlying bottom electrode 102A are not removed, while exposing surfaces of the oxide region 110 and bottom electrode 102A. As shown, etching through gaps 133 removes portions of top electrode layer 122 and electrolyte layer 120 between adjacent bottom electrodes 102A to separate adjacent cell structures from each other. In addition, etching through gaps 132 removes portions of top electrode layer 122 and electrolyte layer 120 over a central area of each oxide region 110/bottom electrode 102A, thereby defining, over each oxide region 110/bottom electrode 102A, a first top electrode 122A and first electrolyte region 120A physically separated from a second top electrode 122B and second electrolyte region 120B. As discussed below in more detail with respect to FIG. 4K, the first top electrode 122A is arranged to interact with a first region of the bottom electrode 102A (via the first electrolyte region 120A) to define a first memory element 140A (indicated in FIGS. 4J and 4K), while the second top electrode 122B is arranged to interact with a second region of the bottom electrode 102A (via the second electrolyte region 120B) to define a second memory element 140B (indicated in FIGS. 4J and 4K). Thus, the etch process forms two distinct memory elements 140A and 140B for each bottom electrode 102A. This may therefore double the density of memory cells as compared to a design in which a single memory element is formed per bottom electrode.

Figure 4J:
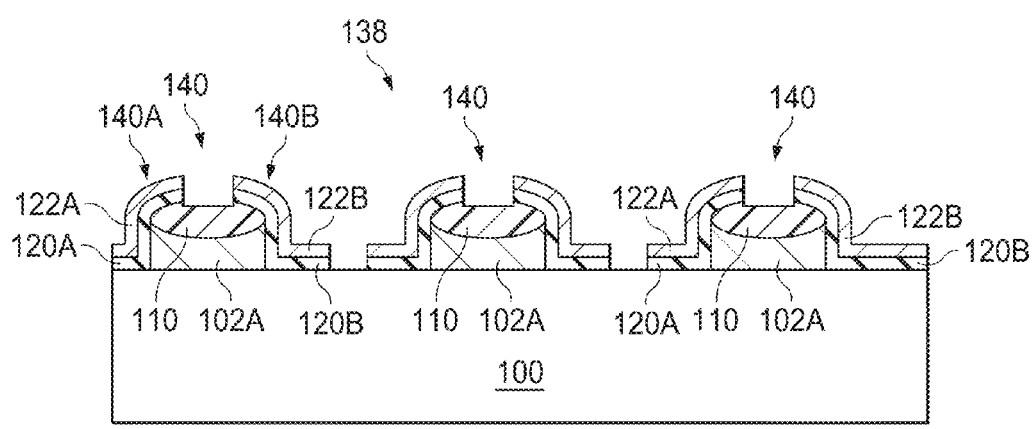

Next, as shown in FIG. 4J, any remaining portions of the photomask 130 may be removed, leaving an array 138 of resistive memory cell structures 140, in which each memory cell structure 140 defines a pair of memory elements 140A and 140B, as discussed above.

Figure 4K:
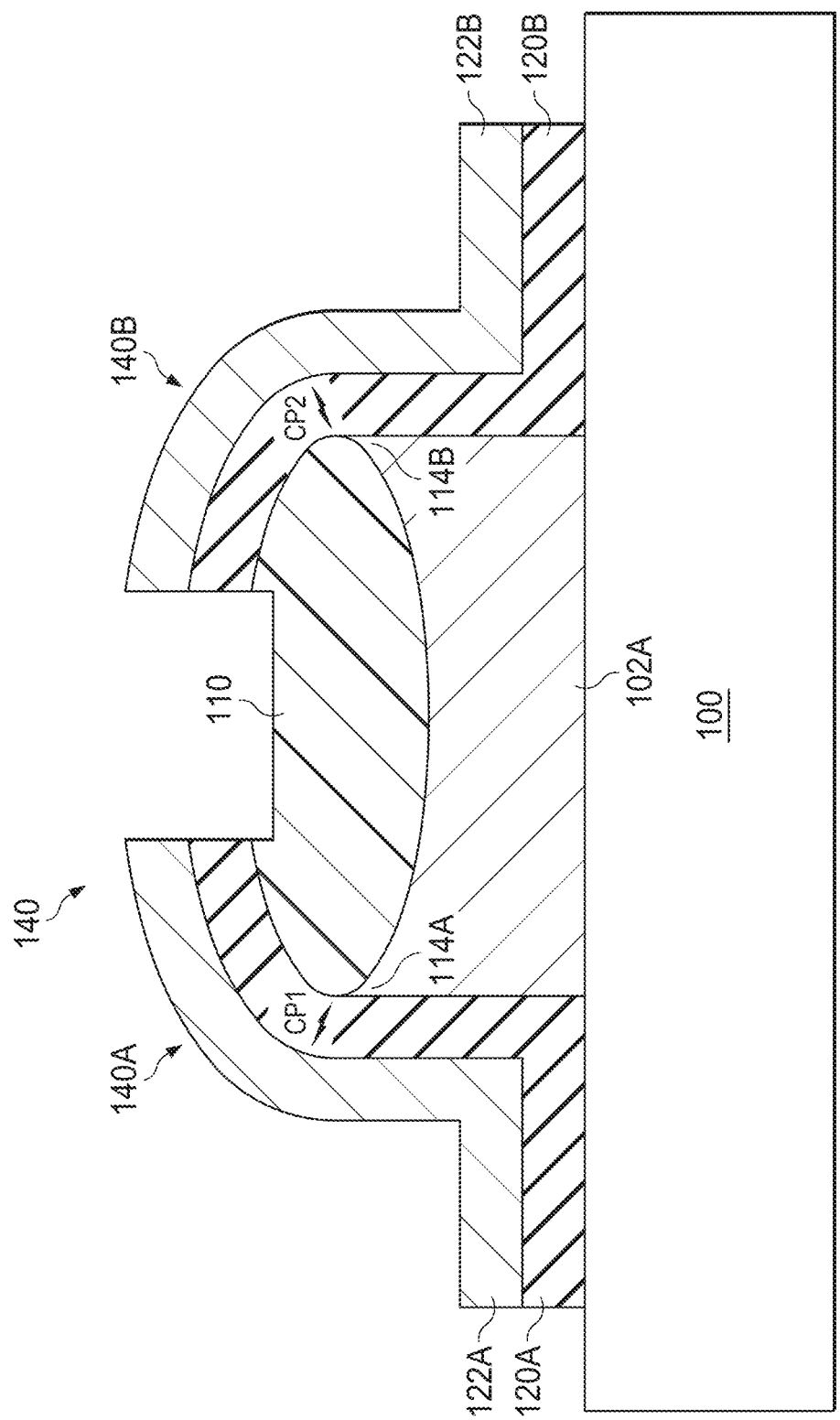

A close-up of one memory cell structure 140 is shown in FIG. 4K. As shown, the memory cell structure 140 defines a pair of memory elements 140A and 140B. The first memory element 140A is defined by a first top electrode 122A, a first portion 114A of the pointed tip region 114 of bottom electrode 102A, and a first electrolyte region 120A arranged therebetween. Similarly, the second memory element 140B is defined by a second top electrode 122B, a second portion 114B of the pointed tip region 114 of bottom electrode 102A, and a second electrolyte region 120B arranged therebetween. In this embodiment, memory element 140A is a mirror image of corresponding memory element 140B. In other embodiments, memory element 140A may have a different shape or structure than its corresponding memory element 140B, e.g., by shifting the etch opening 132 (see FIG. 4I for reference) from the center of the respective underlying bottom electrode 102A, or by forming an irregular-shaped etch opening 132, for example.

The first memory element 140A provides a first conductive path CP1 for the formation of conductive filament(s) or vacancy chain(s) from the first pointed tip region 114A of the bottom electrode 102A to the top electrode 122A through the electrolyte region 120A. Similarly, the second memory element 140B provides a second conductive path CP2 for the formation of conductive filament(s) or vacancy chain(s) from the second pointed tip region 114B of the bottom electrode 102A to the top electrode 122B through the electrolyte region 120B.

The structure of each memory element 140A and 140B, including the respective pointed tip region 114A or 114B, may provide a relatively small, or confined, effective filament formation area $A_{FF}$, or confinement zone. For example, the effective filament formation area $A_{FF}$ for each memory element 140A/140B, measured in a plane generally perpendicular to the direction of filament propagation, may be less than 1,000 $nm^2$. In some embodiments, each effective filament formation area $A_{FF}$ is less than 100 $nm^2$. In particular embodiments, each effective filament formation area $A_{FF}$ is less than 10 $nm^2$, or even less than 1 $nm^2$. These reduced confinement zones may provide resistive memory cells (e.g., CBRAM or ReRAM cells) with more predictable and reliable filament formation, as compared with cells having a larger confinement zone. This may provide one or more of the following benefits: lower erase current, narrower distribution of low-resistance state (LRS), higher on/off ratio (HRS/LRS), and improved failure rates.

Figure 4L:
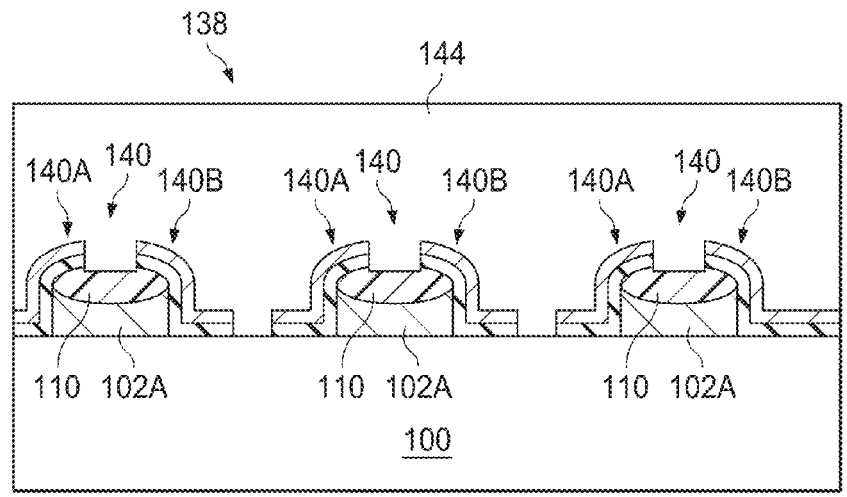
Figure 4M:
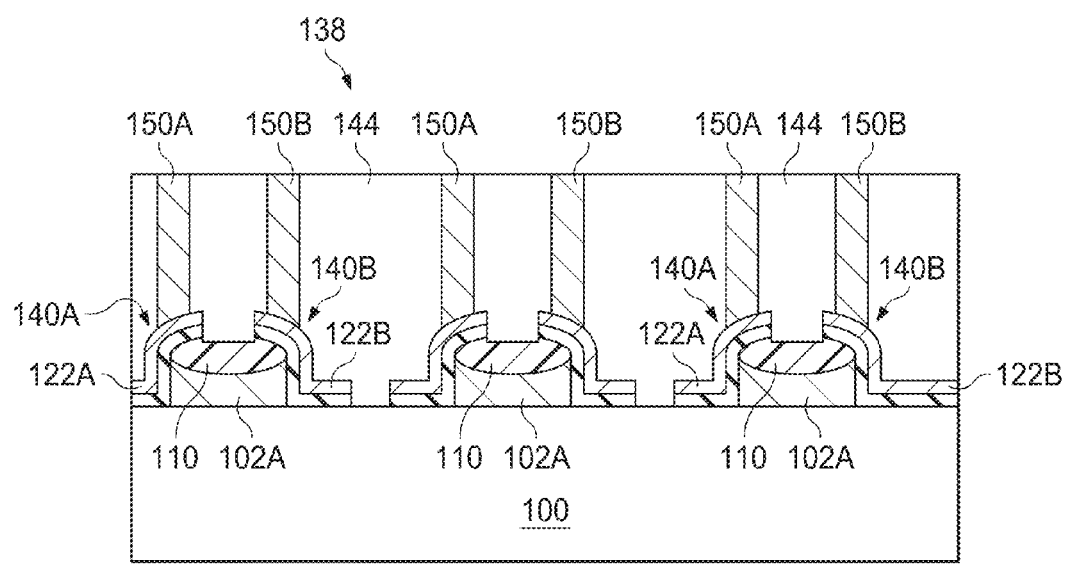

Top electrodes 122A and 122B may be connected in or to any suitable circuitry using any suitable contact scheme. For example, top contacts may be formed in contact with top electrodes 122A and 122B as shown in FIGS. 4L and 4M. First, as shown in FIG. 4L, a dielectric layer 144 may be deposited over the array of memory elements 140A and 140B. Then, as shown in FIG. 4M, top contacts 150A and 150B may be formed in dielectric layer 144, using any suitable techniques. As shown, each top contact 150A contacts an upper portion of a top electrode 122A, while each top contact 150B contacts an upper portion of a top electrode 122B. Top contacts 150 may be arranged in any other suitable manner with respect to top electrodes 122A and 122B and other cell components.

In addition, it should be understood that each bottom electrode 102A may be contacted (e.g., for connection to a wordline or bitline) in any suitable or conventional manner. For example, each bottom electrode 102A may be contacted from above by dropping down a contact that is recessed or offset from the memory films. As another example, each bottom electrode 102A may be contacted from below by depositing the bottom electrode layer 102 directly on a salicided active silicon region and then making contact to the active region at the end of a line of bits.

Although the disclosed embodiments are described in detail in the present disclosure, it should be understood that various changes, substitutions and alterations can be made to the embodiments without departing from their spirit and scope.

The invention claimed is:

1. A method of forming a resistive memory cell, comprising:
    forming a bottom electrode layer on a substrate; oxidizing an exposed region of the bottom electrode layer to form an oxide region, wherein a vertical cross section of the oxide region comprises a non-orthogonal shape;
    removing a region of the bottom electrode layer proximate the oxide region, thereby forming a bottom electrode wherein the non-orthogonal shape of the oxide region creates a pointed tip region at a peripheral edge of the bottom electrode;
    forming:
        (a) a first electrolyte region and first top electrode over a first portion of the pointed tip region of the bottom electrode, such that the first electrolyte region is arranged between the first top electrode and the first portion of the pointed tip region of the bottom electrode to define a first memory element; and
        (b) a second electrolyte region and second top electrode over a second portion of the pointed tip region of the bottom electrode, such that the second electrolyte region is arranged between the second top electrode and the second portion of the pointed tip region of the bottom electrode to define a second memory element.

2. The method according to claim 1, wherein the second electrolyte region and second top electrode are physically separate from the first electrolyte region and first top electrode.

3. The method according to claim 1, wherein the resistive memory cell is a conductive bridging memory (CBRAM) cell.

4. The method according to claim 1, wherein the resistive memory cell is a resistive RAM (ReRAM) cell.

5. The method according to claim 1, wherein:
    the first memory element defines a first path for the formation of a conductive filament or vacancy chain from the first portion of the pointed tip region of the bottom electrode to the first top electrode through the first electrolyte region, and
    the second memory element defines a second path for the formation of a conductive filament or vacancy chain from the second portion of the pointed tip region of the bottom electrode to the second top electrode through the second electrolyte region.

6. The method according to claim 1, wherein a cross-section of the oxide region in a plane perpendicular to the bottom electrode layer has a generally oval shape.

7. The method according to claim 1, wherein a shape of the pointed tip region of the bottom electrode is defined by the oxide region.

8. The method according to claim 1, wherein the pointed tip region of the bottom electrode extends around a perimeter of the bottom electrode.

9. The method according to claim 1, wherein:
    the bottom electrode layer defines an elongated edge at a top side of the bottom electrode; and
    the pointed tip region of the bottom electrode extends along the elongated edge of the bottom electrode layer.

10. The method according to claim 1, wherein the first electrolyte region, first top electrode, second electrolyte region, and second top electrode are formed by:
    depositing an electrolyte layer and a top electrode layer over the bottom electrode and the oxide region; and
    etching away portions of the electrolyte layer and top electrode layer to define the first and second physically separate top electrodes and the first and second physically separate electrolyte regions.

11. The method according to claim 10, wherein etching the portions of the electrolyte layer and top electrode layer exposes a portion of the oxide region above a central area of the bottom electrode.

12. The method according to claim 1, wherein the step of forming a bottom electrode layer comprises: depositing a mask layer on the bottom electrode layer and patterning the mask layer to provide exposed regions of the bottom electrode layer.

13. The method according to claim 1, wherein the pointed tip defines an angle of less than 90 degrees.

14. The method according to claim 1, wherein the bottom electrode layer comprises a left side and a right side and wherein the first electrolyte region and first top electrode are formed over the left side and the second electrolyte region and second top electrode are formed over the right side of the bottom electrode.

15. The method according to claim 1, wherein a top surface of the bottom electrode is shaped concave through the step of oxidizing.

16. A method of forming an array of memory elements, comprising:
    forming a bottom electrode layer on a substrate;
    depositing a mask layer on the bottom electrode layer and patterning the mask layer to provide a plurality of exposed regions of the bottom electrode layer;
    oxidizing the plurality of exposed regions of the bottom electrode layer to form a plurality of oxide regions spaced apart from each other;
    removing the mask layer and regions of the bottom electrode layer between adjacent oxide regions, thereby forming a plurality of bottom electrodes, each bottom electrode having a respective oxide region at an upper side of the bottom electrode and at least a first and second pointed tip region created through the respective oxide region, wherein a vertical cross section of each respective oxide region comprises a non-orthogonal shape;
    for each bottom electrode, forming a pair of memory elements, each memory element defined by the first or second pointed tip region, a respective top electrode, and an electrolyte region arranged there between.

17. The method according to claim 16, wherein forming the pair of memory elements for each bottom electrode comprises:
   forming an electrolyte layer and a top electrode layer over the plurality of bottom electrodes and respective oxide regions;
   removing portions of the electrolyte layer and a top electrode layer to form, over the bottom electrode and respective oxide region:
   (a) a first electrolyte region and a first top electrode over a first pointed tip region, with the first electrolyte region arranged between the first top electrode and the first pointed tip region; and
   (b) a second electrolyte region and a first top electrode over a second pointed tip region, with the second electrolyte region arranged between the second top electrode and the second pointed tip region, wherein the second electrolyte region and second top electrode are physically separate from the first electrolyte region and first top electrode;
   wherein the first top electrode, the first electrolyte region, and the first pointed tip region define a first memory element; and
   wherein the second top electrode, the second electrolyte region, and second pointed tip region define a second memory element.

18. The method according to claim 16, wherein a cross-section of each oxide region in a plane perpendicular to the bottom electrode layer has a generally oval shape.

19. The method according to claim 16, wherein a shape of each pointed tip region of the bottom electrode is defined by the oxide region.

20. The method according to claim 16, wherein the first memory element and second memory element are mirror images of each other.

21. The method according to claim 16, wherein the bottom electrode layer comprises a left side and a right side and wherein the first electrolyte region and first top electrode are formed over the left side and the second electrolyte region and second top electrode are formed over the right side of the bottom electrode.

22. The method according to claim 16, wherein a top surface of the bottom electrode is shaped concave through the step of oxidizing.

23. The method according to claim 16, wherein the first and second pointed tip regions each define an angle of less than 90 degrees.

* * * * *